(12) United States Patent
Van Sloun et al.

(10) Patent No.: US 7,970,585 B2
(45) Date of Patent: Jun. 28, 2011

(54) METHOD AND SYSTEM FOR REMOTE MONITORING AND CONTROL OF WIRELESS CELL-SITES

(75) Inventors: Bruce P. Van Sloun, Minnetonka, MN (US); Thomas Nieman, Greenfield, WI (US); Vincent Jullien, Roswell, GA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 746 days.

(21) Appl. No.: 11/771,504

(22) Filed: Jun. 29, 2007

(65) Prior Publication Data

US 2009/0006010 A1   Jan. 1, 2009

(51) Int. Cl.
*G06F 11/30* (2006.01)
(52) U.S. Cl. ........................................... 702/188
(58) Field of Classification Search .................. 702/63, 702/65, 67, 68, 80, 90, 99, 104, 116, 119, 702/122, 130, 179, 182, 184, 187, 188; 455/343.2; 320/132, 136; 340/541, 636.12
See application file for complete search history.

(56) References Cited

U.S. PATENT DOCUMENTS

| | | | | |
|---|---|---|---|---|
| 5,281,955 | A * | 1/1994 | Reich et al. | 340/636.12 |
| 5,761,622 | A * | 6/1998 | Priest | 455/522 |
| 6,072,984 | A | 6/2000 | Barringer | |
| 6,329,792 | B1 * | 12/2001 | Dunn et al. | 320/132 |
| 6,792,269 | B2 | 9/2004 | Boehmke | |
| 7,146,151 | B2 * | 12/2006 | Arimitsu | 455/343.2 |
| 7,173,570 | B1 | 2/2007 | Wensink et al. | |
| 7,576,517 | B1 * | 8/2009 | Cotton et al. | 320/136 |
| 2003/0162539 | A1 * | 8/2003 | Fiut et al. | 455/424 |
| 2007/0046261 | A1 * | 3/2007 | Porebski | 320/132 |
| 2008/0186171 | A1 * | 8/2008 | Gates | 340/541 |

* cited by examiner

*Primary Examiner* — Mohamed Charioui

(57) ABSTRACT

A method and system for remotely monitoring and controlling one or more cell-sites are disclosed. In one embodiment, the method includes (a) receiving data indicative of a status of at least one battery of at least one cell-site at a remote processing device, where the status relates to at least one of a voltage status, a conductance status, and a temperature status. Additionally, the method includes (b) processing the data at the processing device, and (c) determining at least one further action that should be taken by the at least one cell-site in response to the data. Further, the method includes (d) sending from the processing device at least one control signal to the at least one cell-site configured to cause the at least one cell-site to take the at least one further action. Also, in other embodiments, the method involves remote monitoring and controlling of devices other than batteries.

20 Claims, 4 Drawing Sheets

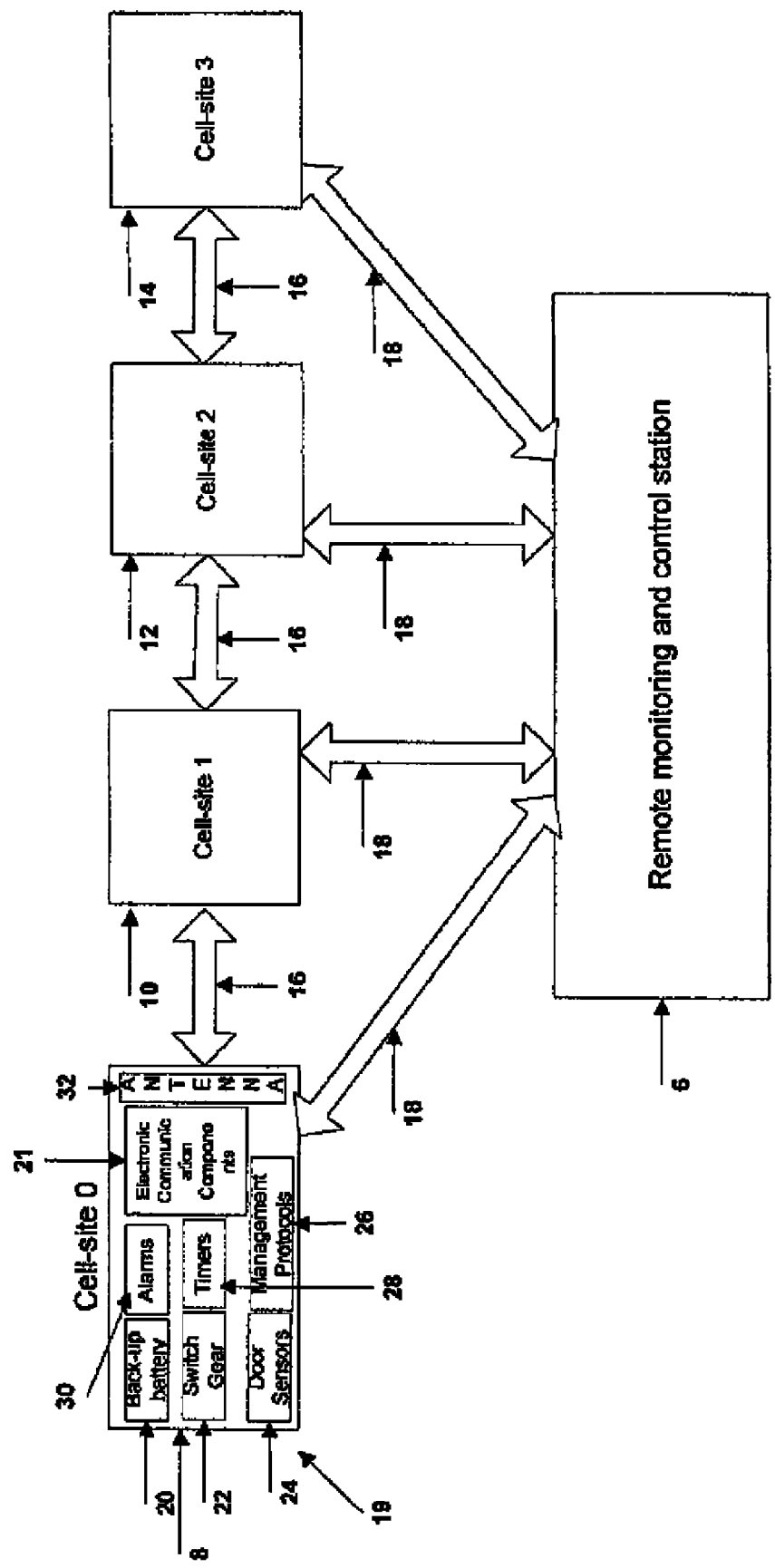

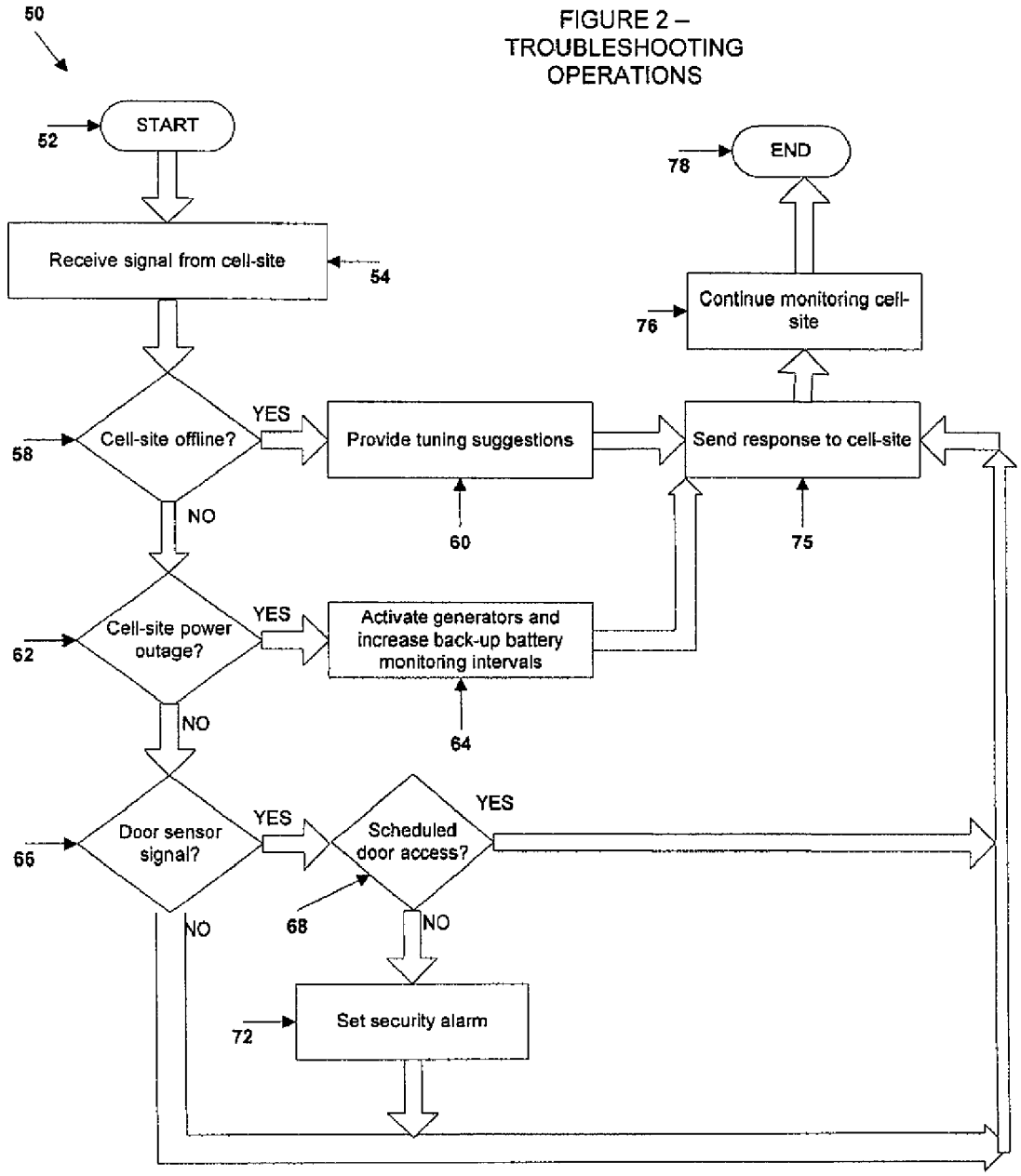

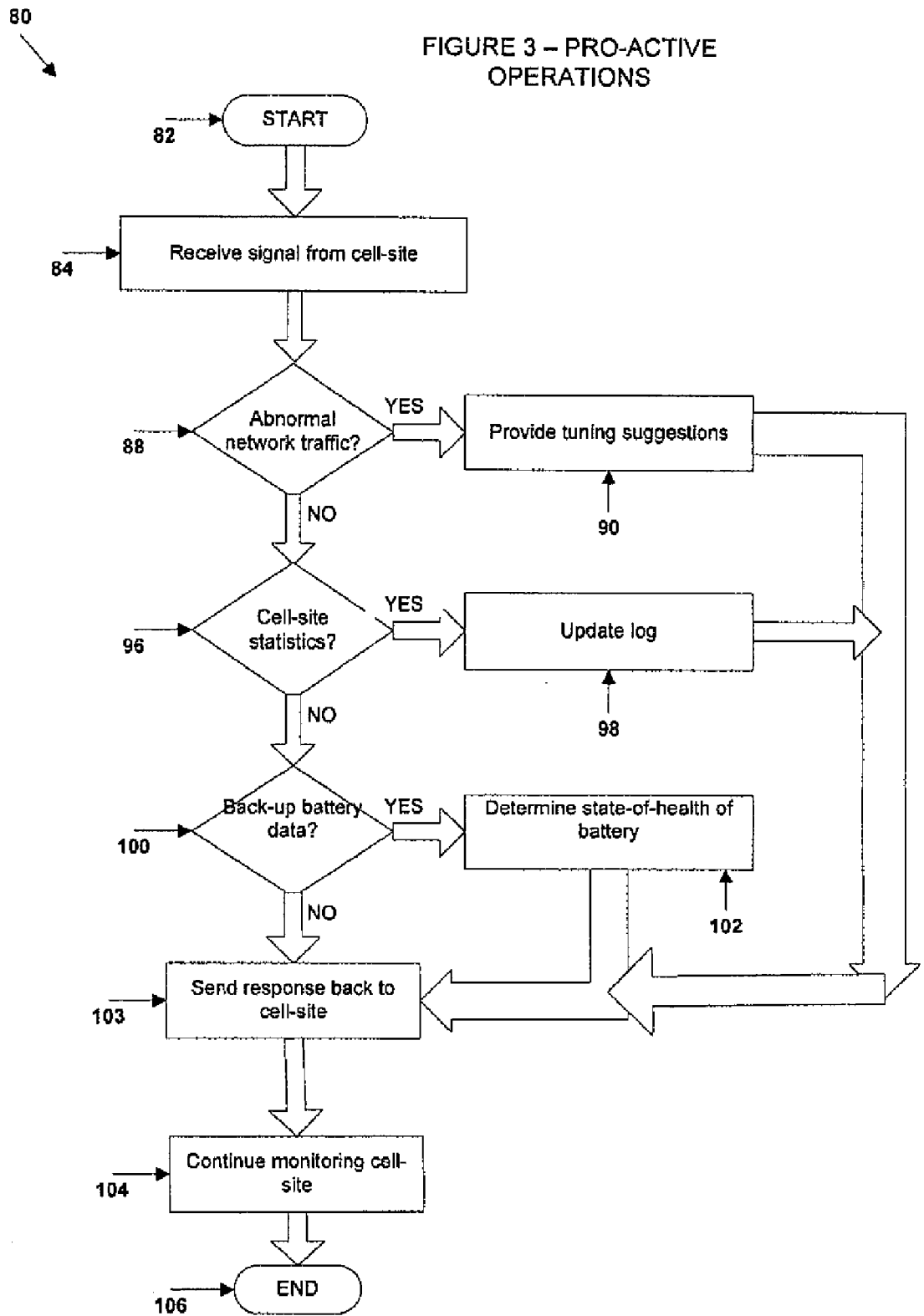

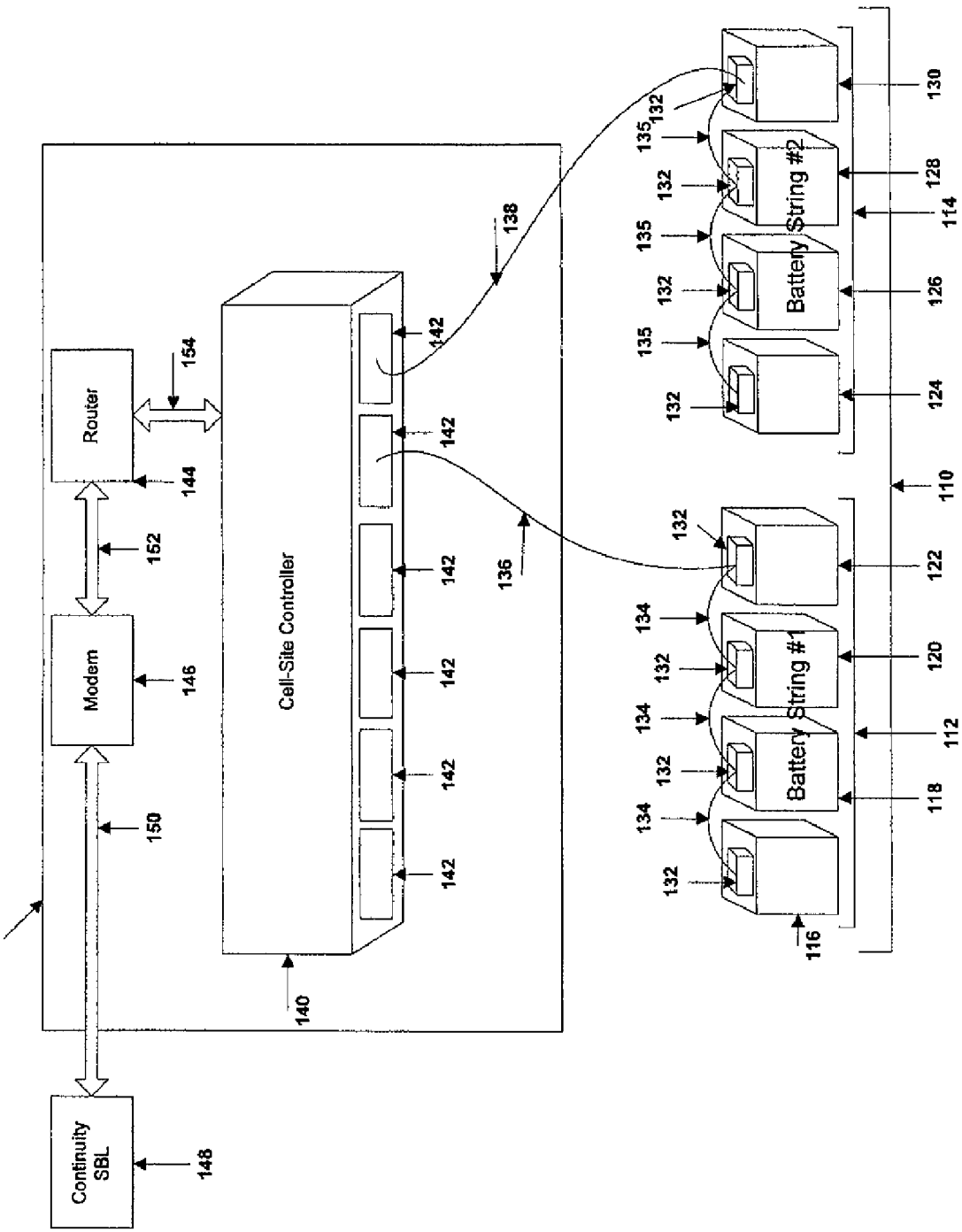
FIGURE 4 – BATTERY MONITORING

METHOD AND SYSTEM FOR REMOTE MONITORING AND CONTROL OF WIRELESS CELL-SITES

CROSS-REFERENCE TO RELATED APPLICATIONS

--

STATEMENT REGARDING FEDERALLY SPONSORED RESEARCH OR DEVELOPMENT

--

FIELD OF THE INVENTION

The present invention relates to wireless communications systems, and more particularly to wireless cell-sites or cellular base stations and to the operation thereof.

BACKGROUND OF THE INVENTION

Wireless communications systems such as cellular systems have become ubiquitous in today's world. To allow for effective operation of cellular systems, numerous cellular towers, or base stations, which also can be referred to as "cell-sites", need to be positioned within respective geographical regions or cells to allow for wide geographic access to the cellular system by cellular telephones (or other wireless devices) that are positioned at, and moved among, a wide variety of locations.

Cell-sites employ a variety of different types of circuitry and other components for their operation. Such components can include, for example, antennas and transceivers, computers and data processing devices, batteries and other power sources, and controllers and related equipment for modifying the physical positioning (or "tilt") and other characteristics of the antennas and other components of the cell-sites. Occasionally, as with any mechanical or electrical systems or components, faults or idiosyncrasies can occur among one or more of the above-described components of one or more cell-sites.

Given the importance of cellular systems in allowing intercommunications among people, computer systems and other systems, it is desirable that cell-sites and the overall cellular systems continue to operate effectively, and/or desirable that, when faults occur among components of such systems, such faults be detected and that actions in response to such faults be taken, as appropriate. For at least these reasons, therefore, it would be advantageous if a method and system could be developed for addressing such issues.

SUMMARY OF THE INVENTION

In at least some embodiments, the present invention relates to a method of remotely monitoring and controlling at least one cell-site. The method includes (a) receiving data indicative of a status of at least one battery (e.g., a power back-up battery) of the at least one cell-site at a remote processing device, where the status relates to at least one of a voltage status, a conductance status, and a temperature status. The method further includes (b) processing the data at the remote processing device, and (c) determining at least one further action that should be taken by the at least one cell-site in response to the data. The method additionally includes (d) sending from the remote processing device at least one control signal to the at least one cell-site configured to cause the at least one cell-site to take the at least one further action.

Additionally, the present invention in at least some embodiments relates to a method of remotely monitoring and controlling at least one cell-site. The method includes (a) receiving data at a remote processing device, where the data is indicative of at least one of (i) an operational status of the at least one cell-site, and (ii) an operational status of at least one component of the at least one cell-site, where the at least one component is selected from the group consisting of a battery, a switchgear, an alarm, a timer, a door sensor, and a transceiver. Also, the method includes (b) processing the data at the remote processing device, (c) determining at least one further action that should be taken by the at least one cell-site in response to the data, and (d) sending from the remote processing device at least one control signal to the at least one cell-site configured to cause the at least one cell-site to take the at least one further action.

Further, the present invention in at least some embodiments relates to a system for remotely monitoring and controlling a plurality of cell-sites. The system includes means for communicating with the plurality of cell-sites, and a processing device coupled to the means for communicating. The means for communicating is configured to receive data from the plurality of cell-sites and convey the data to the processing device, and the processing device is configured to analyze the data and determine, based upon the analyzed data, an operational condition of at least one of the plurality of cell-sites. Additionally, the processing device generates a control signal to be provided to a first of the plurality of the cell-sites, the control signal intended to cause at least one of a corrective operation and a pro-active operation by the first cell-site.

BRIEF DESCRIPTION OF THE DRAWINGS

FIG. 1 shows in schematic form an exemplary cellular system divided into multiple cooperating cell-sites in communication with a central remote monitoring and control station, in accordance with one embodiment of the present invention;

FIG. 2 is a flowchart showing exemplary troubleshooting operations performed by the remote monitoring and control station in response to communications of the cell-sites of FIG. 1;

FIG. 3 is a flowchart showing exemplary pro-active operations performed by the remote monitoring and control station in response to communications of the cell-sites of FIG. 1; and FIG. 4 shows in schematic form a battery monitoring system that can be provided at one or more of the cell-sites of FIG. 1, and that can interact with the remote monitoring and control station for the purposes of monitoring cell-site batteries and taking appropriate control actions in relation thereto.

DETAILED DESCRIPTION OF THE PREFERRED EMBODIMENT

Referring to FIG. 1, an exemplary cellular system 2 servicing a geographical area is shown in a simplified schematic form in accordance with at least some embodiments of the present invention. Typically, cellular systems envision providing wireless coverage over a given geographic area by dividing up that area into multiple cells, where each of those cells has located centrally a respective base station or cell-site that includes an elevated structure or cell tower. The respective placements of the respective cells, and corresponding positioning of cell-sites within those cells, can be influenced by a variety of factors including local geographical or regulatory factors, weather conditions and expected levels of customer usage of the cellular system 2, among others. By appropriately positioning cell-sites within the various cells, the cellular system 2 desirably is capable of communicating with numerous cellular telephones and/or other wireless devices (e.g., personal digital assistants) that are positioned within, and move around within, any of the various cells of the cellular system.

In the present embodiment shown in FIG. 1, the cellular system 2 includes four cooperating cell-sites 8, 10, 12 and 14 that are in communication with one another as represented by communication links 16. In addition to communicating with each other, the cell-sites 8-14 in the present embodiment also communicate with a remote monitoring and control station 6 (referred to as remote station hereinafter), as indicated by additional communication links 18. The remote station 6, as will be described in further detail below, is a central platform allowing for remote monitoring and controlling of the cell-sites 8-14. While the cell-sites 8-14 should be understood as being geographically positioned at locations corresponding to different cells of the cellular system 2, the remote station 6 need not be assumed to have any particular geographical position relative to the cell-sites 8-14 or anything else (and in particular need not be assumed to have a geographical position to the side of the cell-sites as shown in FIG. 1).

Generally, the communication links 16 and 18, which facilitate communication amongst the cell-sites 8-14 and between those cell-sites and the remote station 6 respectively, can be any of a wide variety of types of communication links or networks including, for example, landline (e.g., copper) wiring, optical fiber, microwave communications, radio channels and possibly other wireless communication links, including links involving the Internet or World Wide Web. In the present embodiment, however, the communication links 16 and 18 are assumed to be wireless communication links utilizing the same types of signals and protocols as are used by cellular telephones that are in communication with the cell-sites 8-14. Thus, in the present embodiment the cell-sites 8-14 communicate with the remote station 6 in a full duplex manner, such that information can be received and transmitted simultaneously by sending and receiving messages on two different frequencies. Because each cell-site 8-14 has its own respective transceiver, multiple cell-sites can simultaneously communicate with the remote station 6.

Notwithstanding the fact that the present embodiment has four cell-sites 8-14 and a single remote station 6 for interacting with and/or managing those cell-sites, depending upon the embodiment the cellular system 2 can alternatively employ any number of cell-sites larger or smaller than four and, indeed, in many embodiments dozens or hundreds of cell-sites (or more) can be employed. Likewise, while the single remote station 6 is shown in FIG. 1, in alternate embodiments multiple such stations can be employed.

Further as shown in FIG. 1, each of the cell-sites 8-14 includes or has mounted thereon a variety of components 19, one or more of which can be monitored and/or controlled by the remote station 6 as will be described further below. Although FIG. 1 in particular shows the components 19 of the cell-site 8, for purposes of the present discussion it can be understood that each of the other cell-sites 10-14 has the same (or similar) components. Nevertheless, in other embodiments the particular components of different cell-sites can vary depending upon the cell-site.

Among the components 19 of the cell-site 8 are multiple electronic communication and processing components 21 including, for example, digital signal processors, control electronics, transceivers (or individual transmitters and/or receivers), global positioning system receivers, and other components, at least some of which allow for communications among the respective cell-sites 8-14 and between the cell-sites and the remote station 6. Additionally, the cell-sites 8 includes various software-type components that can generally be referred to as management protocols and software applications 26, for interpreting and responding to signals received from the remote station 6, as well as timers 28 for scheduling troubleshooting and/or maintenance events. Depending upon the embodiment, the components 21, 26 and 28 can perform various other operations including, for example, operations related to validating, billing and connecting wireless calls to other wireless and wired telephone systems.

Additionally, the components 19 includes several power system components, including a switchgear 22 that governs the provision of power from a power grid (not shown) to the cell-site 8, as well as a backup battery source 20 for providing backup power to the cell-site 8 during a loss of conventional power. Further, the components 19 of the cell-site 8 include door sensors 24 for determining unauthorized accesses through doors (as well as opening, closing, locking and/or unlocking doors or other access mechanisms), alarms 30 for providing visual and/or audible warning signals indicative of faults or other system conditions.

Also, the components 19 include a high power antenna system 32 that is coupled to the transceiver of the components 21, which allows for wireless communications between the cell-site 8 and the other cell-sites 10-12 as well as the remote station 6 in the present embodiment. The high power antenna system 32 typically includes mechanical actuators capable of influencing the physical positioning or configuration (e.g., the "tilt") of one or more antennas of the antenna system. In at least some embodiments, each of the respective components 19 can be assigned (or assign to itself) a respective code or codes that uniquely identifies that component. By utilizing such codes, various communications between the remote station 6 and the cell-sites 8-12 including, for example, alarms and/or alerts generated by the remote station 6 in the form of SNMP (Simple Network Management Protocol) traps, can be purposefully directed or restricted to particular ones of these devices.

With respect to the remote station 6, in the present embodiment it is shown to be a centralized station that is in direct communication with each of the cell-sites 8-14 by way of the communication links 18, albeit in alternate embodiments the station may only be indirectly in communication with any given cell-site (e.g., by way of one or more others of the cell-sites). Although the internal components of the remote station 6 are not shown in FIG. 1, the remote station can be understood to include one or more transceivers and antennas, and/or other interfaces for allowing communications with outside communication links, and one or more computer system(s) and other processing equipment, as well as possibly various other input and output devices.

Depending upon the embodiment, the remote station 6 can be controlled by human operator(s) and/or one or more computer system(s). As will be described further below, the remote station 6 is capable of performing various operations allowing for the remote monitoring and/or control of the cell-sites 8-14 and/or one or more of the components 19 on those cell-sites. In general, the remote station 6 serves to monitor and control operation of the cell-sites 8-14 so that the overall cellular system 2 is capable of providing continuous, uninterrupted service to the users of cellular telephones and/ or other wireless communication devices that are positioned within the geographical area covered by the cells of the cellular system.

More particularly, the computer system(s) and other processing equipment of the remote station 6, along with management protocols and/or software applications implemented in conjunction therewith, allow for managing of the communications between the cell-sites 8-14 and the remote station, reporting and data-logging information from the cell-sites, analysis of the signals received including any alarms, and responding to the signals received from the cell-sites (and maintaining logs of such communications). Furthermore, although in the present embodiment the cell-sites are monitored continuously, in other embodiments, periodic monitoring can be performed as well.

Remote monitoring and control of the individual cell-sites 8-14 by way of the remote station 6 can provide numerous advantages. To begin with, real-time alarming and/or prediction of imminent faults that may occur at individual cell-sites 8-14 can reduce the costs associated with unscheduled truck rolls (e.g., service calls) to replace defective components. Further, if faults occur, rapid and timely responses to outages based on known conditions or state information regarding the cellular system 2 can be performed at any given time. In addition, by actively monitoring the cell-sites 8-14, the remote station 6 in at least some embodiments is capable of analyzing actual field performance of the various components 19, and capable of providing management of current and potential trouble spots across the cellular system 2. Therefore, by deploying such a centralized system across the cellular network, operators can minimize the impact to customers due to disruption of the cellular system 2, as well as enhance overall system performance.

Turning to FIG. 2, a flowchart 50 shows an exemplary process according to which the remote station 6 is capable of performing various troubleshooting operations in response to signals received from certain of the components 19 of the cell-sites 8-14, in accordance with at least some embodiments of the present invention. As shown, after the process begins at a step 52, a signal is received at a step 54 from one of the components 19 of one of the cell-sites 8-14. Although the signal can potentially originate with any of the components 19 (e.g., the components 20, 21, 22, 24, 26, 28, 30 and 32 shown in FIG. 1 or others) of a given one of the cell-sites 8-14, it will be understood that in the present embodiment each of those signals will be communicated from the respective cell-site onto the respective communication link 18 by way of the cell site's respective transceiver and antenna. By virtue of an identification code incorporated into the signal received from the component 19, the transceiver on the remote station 6 can identify precisely which one of the components 19 of which one of the cell-sites 8-14 was the source of the signal.

After making a positive determination about the source of the incoming signal, the remote station 6 proceeds to determine the nature of the problem, as indicated by a series of steps 58, 62 and 66. In particular, at a step 58, a first determination is made regarding the status of the cell-site—whether it should be considered off-line or on-line. Cell-sites can occasionally experience signal interferences and/or hardware malfunctions that can lead the cell-sites to function improperly, thereby causing a cell-site outage. Depending upon the embodiment, the remote station 6 can potentially determine whether a given cell-site is off-line in different ways, for example, upon receiving a special "off-line" signal from the cell-site, or upon failing to receive an expected, periodic signal from the cell-site. In any event, if the remote station 6 positively determines that a cell-site outage has occurred, the process advances to a step 60. Upon the occurrence of the step 60, the remote station 6 proceeds to offer appropriate tuning (or other reconfiguration) suggestions, to the cell-site that went off-line and/or to one or more other cell-sites.

More particularly, in at least some embodiments, upon a given cell-site going off-line it is desirable to adjust the operational status of other cell-sites in an effort to compensate for the cell-site outage. Typically, the antenna system 32 of each of the cell-sites 8-14 is adjusted to provide a desired coverage area. However, various considerations such as whether cell-sites are added/removed from the cellular system 2, whether existing cell-site have experienced outages, and/or whether there have been changes in cellular telephone usage patterns can affect whether a desired coverage area can be attained. Thus, in the event of an outage of a given cell-site, one possible course of action that can be taken in order to compensate for the outage entails reorienting the tilt of the antennas and/or varying the power output and signal sensitivity of adjacent cell-sites.

For example, suppose that the remote station 6 detects that the cell-site 10 of FIG. 1 has experienced an outage. Notwithstanding the outage of that cell-site, it is still possible that most or all of the corresponding geographical region (cell) covered by the cell-site 10 can otherwise be covered by the cell-sites 8 and 12 adjacent to the cell-site 10, particularly if the operational configurations of those cell-sites were adjusted. Thus, after determining (e.g., based upon a list) that the cell-sites 8 and 12 are the neighboring cell-sites of the cell-site 10, the remote station 6 can remotely control the angle of the antenna tilt (e.g., "uptilt" the antenna) and/or adjust the RF uplink and down link amplification of those adjacent cell-sites to mitigate the effects of the cell-site outage. Upon taking this action, the remote station 6 at a step 75 then can further send a signal back to the cell-site 10 that experienced the outage, indicating that the responsive action has been taken, and at a step 76 can continue monitoring that cell-site (as well as the other cell-sites).

On the contrary, if at the step 58 it is determined that the signal received at the step 54 does not pertain to an outage in the cell-site transmitting the signal, the remote station 6 then alternatively at a step 62 makes a determination as to whether the cell-site sending the signal has experienced a power loss. In the present embodiment, the cell-sites 8-14 include backup battery sources that are configured to automatically supply power to the cell-sites in the event of a loss of power from the power grid. However, if the backup battery sources themselves fail to provide adequate power, then the cell-sites are susceptible to complete power outages unless further steps are taken.

In the present exemplary process of FIG. 2 in particular, if a determination is made by the remote station 6 that a power loss has occurred, the remote station presumes that the backup battery source 20 of that cell-site is not working properly. As a result, the process advances to a step 64, in which the remote station 6 determines that a signal should be sent to the cell-site experiencing the power loss intended to cause additional emergency measures to be taken. Various emergency measures can be commanded such as, for example, the activation of emergency backup generators as well as the increasing of backup battery monitoring intervals. Subsequent to the step 64, the process advances to the step 75, at which the appropriate signals are sent to the cell-site that experienced the power outage. Once this action is taken, and assuming that a further signal is received by the remote station 6 from the cell-site that experienced the power outage that the commanded action has in fact been taken, the process again proceeds to the step 76 discussed above.

Further as illustrated by FIG. 2, if no cell-site power outage is detected at the step 62, then the process advances to the step 66, at which the remote station 6 determines whether the signal received at the step 54 indicates that one of the door sensors has been triggered at the cell-site. If a door sensor signal indicating a door access is detected, then the remote station 6 further determines at a step 68 whether the opening/closing of the door that triggered the door sensor signal was in fact a valid door access, as might be indicated by a door access schedule available to the remote station. If at the step 68 it is determined that the door sensor signal is consistent with a pre-scheduled door access, the remote station 6 proceeds to the step 75 and sends a signal back to the originating cell-site indicating that the door access is acceptable, after which the remote station again proceeds to the step 76 in which it continues to monitor that cell-site. On the contrary, if at the step 68 it is determined that the door sensor signal is unexpected, the process advances to a step 72 in which it is determined that an alarm signal should be triggered, and subsequently advances to the step 75 in which the remote station sends a signal to the originating cell-site commanding the alarms 30 of that cell-site to be activated. Then the process again proceeds to the step 76.

The step 76 is generally representative of continuous monitoring of the cell-sites 8-14 by way of those cell-sites sending information to the remote station 6, which in turn performs analysis on the information received. Thus, although the process of FIG. 2 is shown to end at a step 78 after the performing of the step 76, it will be understood that the process typically is performed on a repeated, substantially continuous basis. Further, although the flowchart 34 of FIG. 2 relates to certain exemplary cases of troubleshooting operations that can be performed by the remote station 6, it is nevertheless intended that the present invention encompass a wide variety of other manners of operation of remote stations by which the remote stations analyze information provided by cell-sites and take actions in response thereto to alert or inform appropriate operator(s)/staff, correct or otherwise address conditions of the cell-sites.

While FIG. 2 shows exemplary responses of the remote station 6 to events or conditions that have already occurred (and that may require immediate attention), FIG. 3 in contrast shows pro-active monitoring operations that can be performed by the remote station 6 for the purpose of gaining insight into the performance of the various components 19 of the cell-sites 8-14 or for other purposes. The pro-active monitoring operations further allow the remote station 6 to take additional control actions to achieve various goals including, for example, preventive maintenance. Further, by virtue of the monitoring, a framework for cross component usage across the various cell-sites 8-14 can be developed and operational changes can be performed in an automated way. The proactive approach to status monitoring supports improved quality of service, insures higher availability during emergency conditions, and reduces operational cost.

As shown in FIG. 3, an exemplary flowchart 80 shows exemplary proactive operations of the remote station 6 involving communication between that station and the cell-sites 8-14, in accordance with at least some embodiments of the present invention. As shown, after starting at a step 82, at a step 84 the remote station receives signals from one of the cell-sites 8-14, for example, the cell-site 8. As was described above, the cell-site 8 providing the signal can be identified by the remote station 6 based upon the unique code appended to the signal. Subsequent to the step 84, the remote station 6 is capable of taking various additional actions based upon the content of the received signal, as determined in a series of steps 88, 96 and 100.

More particularly, upon completion of the step 84, the process first advances to the step 88, at which it is determined whether the signal received in the step 84 is indicative of abnormal network traffic at the cell-site 8 that transmitted the signal. Deteriorating network performance in particular can potentially indicate a need to retune the network. If the signal indicates this to be the case, the process then proceeds to a step 90. At this step, the remote station 6 attempts to determine actions that can be taken by the originating cell-site 8 and/or possibly others of the cell-sites 10-14 that would better accommodate the network traffic patterns, and then at a further step 103 provides signal(s) to the originating cell-site and/or others of the cell-sites commanding or suggesting that those cell-site(s) take those actions.

A variety of different types of actions can be taken depending upon the circumstance, including a variety of different actions to tune one or more of the cell-sites 8-12. For example, the remote station 6 in some circumstances can react by offering antenna tilt suggestions to the originating cell-site 8. Also for example, the remote station 6 can react by commanding certain neighboring cell-sites (e.g., the cell-sites 10 and 12) of the cell-site 8 to down-tilt their antenna systems 32 at specific times during the day to accommodate commuter traffic load along commuter paths. In general, by receiving data from the cell-sites (and/or other systems), individual cell-sites can be remotely reconfigured and adapted to accommodate changes reflected in the data, through automated scripting, by way of engineering staff using the remote capabilities, or in other manners. Once the remote station 6 has determined the actions to be taken at the step 90 and sent appropriate signals to the cell-site(s) 8-14 at the step 103, the process then advances to a step 104 in which the remote station 6 continues to monitor the cell-site(s).

On the contrary, if at the step 88 it is determined that the incoming signal does not relate to abnormal network traffic, the process instead proceeds to a step 96, in which it is determined by the remote station 6 if the incoming signal includes information regarding normal usage characteristics or other statistical information of one or more of the cell-sites, for example, the cell-site 8. Such cell-site statistical information can be provided in response to pre-scheduled monitoring events and can include statistics concerning operation(s) of any one or more of the components 19 of the given cell-site 8 other than the backup battery source 20 including, for example, statistics regarding the tilt angle of the antenna system 32, etc. If a positive determination is made that the incoming signal includes statistical information, the remote station 6 updates a log report at a step 98 with the statistical information.

The log report is a file or files, stored at the remote station 6, in which the performance and/or modifications of one or more of the cell-sites are tracked. In addition, the log report also can record changes to the thresholds, and other conditions, such as those that will trigger alarms, including settings by particular operators (such that personal responsibility of such changes can be monitored). Subsequent to successfully updating the log file, again the process advances to the step 103, in which a response is sent by the remote station 6 back to the originating cell-site 8. The response can be, for example, an acknowledgement that remote station 6 received the statistical information or, alternatively for example, a further inquiry for additional information. Subsequently, the process then advances to a step 104 in which the remote station 6 continues to monitor the cell-site(s).

If at the step 96 it is determined by the remote station 6 that the incoming signal does not include statistical information regarding one or more of the components 19 other than the backup battery source 20, then the process advances to a step 100, in which the remote station 6 further determines whether the incoming signal concerns information regarding particularly the backup battery source 20 of one of the cell-sites such as, again for example, the cell-site 8. If at the step 96 it is determined that the incoming signal does relate to backup battery data, the process proceeds to a step 102, at which the remote station 6 processes that information as appropriate. In at least some embodiments, and as will be described below with respect to FIG. 4, the backup battery source 20 encompasses multiple discrete backup batteries that are monitored by way of an overall monitoring system. In such embodiments, the information provided by the cell-site 8 and recognized by the remote station 6 in the step 100 is processed at the step 102 to determine a state of health (SOH) of the backup battery or batteries. Subsequent to the determining of the SOH of the backup battery (or other determinations), the process advances again to the step 103, at which a response is sent back to the cell-site 8 (and/or possibly other cell-sites), and subsequently to the step 104 to continue monitoring the cell-site X and other cell-sites for any additional signals.

In the event that the backup battery source 20 is determined to not be healthy and headed for an inoperable state, the response provided at the step 103 also potentially can include one or more commands or instructions. For example, the sending of the response including, for example, a command to switch between different batteries, a command to trigger an alarm that a battery needs to be replaced, or a command to adjust the antenna system configuration (e.g., the "tilt") of the cell-site 8 (or possibly others of the cell-sites) so as to be more appropriately positioned in case of a power outage accompanied by a backup battery failure. Also, if at the step 100 it is determined that the incoming signal did not pertain to backup battery data, the process also advances to the step 104 and continues to perform monitoring. Subsequently, at some time, the process ends at the step 106 (or repeats by returning to the step 82).

Notwithstanding the exemplary process scenarios illustrated by FIGS. 3 and 4, the present invention is intended to encompass numerous variations of those processes as well as numerous other processes in alternate embodiments. For example, in other embodiments, the remote station 6 can monitor and perform control operations in relation to a variety of other cell-site components and characteristics and related environmental conditions such as grounding system performance, tower lighting monitoring, HVAC (heating, ventilation and air conditioning) system performance, backup/ancillary alarm monitoring, atmospheric data collection and distribution, monitoring and testing as it pertains to interconnects/networks/communication links (e.g., the communication links 16 and 18), infrastructure maintenance scheduling and dispatching, external activation verification, monitoring of reflective power for proactive maintenance, and multiple protocol performance monitoring and testing.

Turning to FIG. 4, in at least some embodiments the cell-sites 8-14 can be constructed in a manner that facilitates monitoring and controlling of the back-up battery source 20 by the cell-sites themselves and/or the remote station 6. More particularly, in the embodiment shown in FIG. 4, a given one of the cell-sites (e.g., the cell-site 8) includes not only a backup battery source 110, which can be understood to correspond to the backup battery source 20 of FIG. 1, but additionally includes a battery monitoring system 108 that monitors those batteries, which can be considered part of the electronic communication components 21 of FIG. 1. Further in the present embodiment, the battery monitoring system 108 is configured to interact with a continuity standard battery life software (continuity-SBL) package 148, which can be implemented on the remote station 6, and which is in communication with the battery monitoring system 108 by way of a communication link 150 that is intended to be representative of one of the links 18 as well as the antenna system 32 of the cell-site on which the battery monitoring system is implemented.

Further in accordance with the present embodiment, the battery monitoring system 108 utilizes conductance testing to monitor the backup battery source 10. Conductance testing is an ohmic technique used to identify the electrical or ohmic "signature" of a lead acid battery or cell, which can be associated with a battery's SOH condition. Conductance is a measurement of a battery's ability to produce current, or its electrical efficiency, and is quantified in Siemens or Mhos (the reciprocal of Ohms). Conductance test results are obtained by performing a calculation of the relationship between electrical resistance with combinations of either AC or DC current and voltage measurements on the subject battery. A wide variety of factors can impact a battery's ability to perform properly including, for example, normal aging and use, sulfating of a battery's plate surface, active material shedding, and various chemical changes. Such factors in particular can adversely affect a battery's ability to perform and decrease the battery's conductance as the battery's power is consumed. In short, higher conductance values generally are indicative of improved performance from a battery. A battery's SOH can also be determined by comparing conductance measurements of that battery with conductance measurements of other similar batteries used in the same system.

As shown, the backup battery source 110 that is monitored by the battery monitoring system 108 includes first and second battery strings 112 and 114, each of which further includes multiple battery cells. More particularly, the first battery string 112 includes backup battery cells 116, 118, 120 and 122 and the second battery string 114 includes backup battery cells 124, 126, 128 and 130. Each of the individual battery cells 116-130 can be any type of battery. For example, in the present embodiment, lead-acid battery cells are used although other embodiments can potentially use other types of wet or dry battery cells depending upon the backup power infrastructure required. Each of the battery strings 112, 114 can be set up to handle a pre-determined voltage, which can limit the number of individual battery cells that each battery string will handle. For example, assuming a 24 Volt string voltage and 6 Volt battery cells, each battery string can have a maximum of 4 batteries as shown. Notwithstanding the fact that the present embodiment has two battery strings each having four battery cells, in other embodiments the number of battery strings and/or the number and types of battery cells within a battery string can all vary depending upon the requirements and capacity of a particular cell-site.

Further as shown, in addition to the battery cells 116-130, the backup battery source 110 additionally includes respective battery sensors 132 mounted on (or otherwise in communication with) each respective battery cell. Each of the battery sensors 132 is an electrical circuit mounted upon and in electrical communication with its respective one of the battery cells 116-130. In the present embodiment, each of the battery sensors 132 more particularly is a BatteryAgent™ Sensor Module as is available from Phoenix Broadband Technologies, LLC of Montgomeryville, Pa., although other types of battery sensors can be used as well. The battery sensors 132 of the battery cells 116-122 and 124-130 in the battery strings 112 and 114, respectively, are connected together in a "daisy chain" fashion by way of respective cables and connectors 134 and 135, respectively. The cables and connectors 134, 135 can, for example, be CAT-5 cabling and RJ-45 connectors, albeit other types of cables and connectors can be used as well. Further as shown, each daisy-chain of cables and connectors 134 and 135 corresponding to the respective battery strings 112 and 114, respectively, is coupled to a respective port 142 of the cell-site controller 140 by way of additional cables 136 and 138, respectively. To prevent damage to the battery cells 116-130, the cables/connectors 134, 135, 136 and 138 and the cell-site controller 140, each of the battery sensors 132 is internally fused.

To determine the SOH of the backup battery source 110 and particularly the respective battery cells 116-130, the battery sensors 132 are programmed to measure the conductance of their respective battery cells and also can measure other parameters including, for example, the terminal voltages, post temperatures and other characteristics of their respective battery cells. Conductance testing can be performed on the backup battery source 110 to measure the SOH of the complete backup battery source or individual battery cells 116-130 can be tested as well. To measure the conductance of a given one of the battery cells 116-130, a low frequency AC voltage signal is sent through the respective battery by the battery sensor 132, and subsequently a portion of the AC current response is captured by the battery sensor, which then calculates a conductance value. The data collected is sent to the cell-site controller 140, which as described further below is capable of real time measurement, alerts and reporting of the status of the backup battery source 110 and its respective battery cells 116-130.

The battery monitoring system 108 of FIG. 4 in the present embodiment performs conductance testing to provide an accurate, reliable and low-cost process for remotely measuring the SOH of the backup battery source 110. In the present embodiment, the battery monitoring system 108 is a PowerAgent™ Battery Management System as is available from the aforementioned Phoenix Broadband company, although other battery monitoring devices capable of performing conductance testing can be used as well. As shown, the battery monitoring system 108 includes a cell-site controller 140, a router 144, and a modem 146, where the modem is coupled to the router by way of a communication link (or links) 152 and the router is coupled to the cell-site controller 140 by way of an additional communication link (or links) 154. In the present embodiment, the modem 146 is a cellular modem and the router 144 is a wireless-G router as available from the Linksys company of Irvine, Calif., albeit other types of modems and routers (including wired/fixed routers) and/or other communication mechanisms can potentially be used as well. Although not shown, it will be further understood that the router 144 can potentially be coupled to one or more additional cell-site controllers that in turn are coupled to other backup battery sources at the given cell-site.

With respect to the cell-site controller 140 in particular, in the present embodiment it is a PowerAgent™ Site Controller available from the Phoenix Broadband company mentioned above, although other types of site controllers can be used as well. As such, the cell-site controller 140 is a small rack-mountable electrical management platform unit that receives data from each of the battery sensors 132 by way of the cables 136, 138, monitors the battery sensors 132 and additionally makes the data collected from those sensors available to the router 144 by way of the communication link(s) 154, which can be a local area network (e.g., Ethernet link). Such information can in turn be provided to the router 146 by way of a similar network and ultimately to the remote station 6/continuity-SBL software package 148 by way of the communication link(s) 150, allowing for monitoring and control/management operations to be performed thereby.

In the present embodiment, the cell-site controller 140 in particular is designed to allow for internet or web-based accessing of information by way of the remote station 6/continuity-SBL software package 148. More particularly, in the present embodiment the cell-site controller 140 has several user interface mechanisms built-in, including a web server that stores and can be accessed to provide information regarding the cell-site, the battery strings 112 and 114, and the individual batteries 116-130, as well as an SNMP (Simple Network Monitoring Protocol) interface that allows any SNMP compliant management software to collect data and perform battery tests. Additionally, the cell-site controller 140 also includes a password-protected Telnet port for remotely configuring the unit, a DHCP (Dynamic Host Configuration Protocol) client that automatically obtains an IP (internet protocol) address from a DHCP server, and a TFTP (Trivial File Transfer Protocol) server for uploading firmware changes remotely.

Typically, the modem 146 serves as an access point by which the continuity-SBL software package 148 of the remote station 6 can obtain information regarding the backup battery source 110. Additionally, the modem 146 can allow instructions and commands to be provided from the continuity-SBL software package 148 of the remote station 6 to be provided to the cell-site controller 140 (and possibly other cell-site controllers that are in communication with the router 144), which in turn can take actions intended to adjust battery operation and/or compensate for battery power fluctuations. Where multiple cell-sites (e.g., the cell-sites 8-14) are in communication with the remote station 6, and each of the cell-sites employs backup battery source(s) such as the backup battery source 110 and battery monitoring system(s) such as the battery monitoring system 108, the continuity-SBL software package 148 can operate in a manner intended to coordinate the various cell-sites and account for various conditions (and possibly faults) occurring at those cell-sites in relation to their respective backup battery sources.

The continuity-SBL software package 148 in the present embodiment is a flexible and affordable, web-enabled battery prediction and status monitoring software package as is available from Seldon Systems of Alpharetta, Ga. In other embodiments, other software packages or devices capable of monitoring and analyzing conductance data and other types of battery-related data, and/or determining commands in response thereto, can be used as well. The continuity-SBL software package 148 in at least some embodiments provides operators at the remote station 6 with a centralized, feature-rich tool to monitor many or all backup batteries in the overall cellular-network encompassing multiple cell-sites. Thus, the software package 148 and related infrastructure helps operators reduce the likelihood of cell-site outages due to unexpected battery cell failures upon failure of the local power grid. Warning signs of unacceptable operating conditions (including the end of a given battery's life) can be detected and/or predicted, and corrective actions can be scheduled under non-emergency conditions, significantly reducing costs. This proactive approach to status monitoring supports improved quality of service, insures higher availability and reduced customer disruption during emergency conditions, increases battery asset utilization, network-up time and resultant customer revenue and loyalty, and reduces operational cost through preventive maintenance.

From the above discussion, therefore, it should be apparent that various embodiments of the present invention are advantageous in one or more regards. For example, at least some embodiments of the present invention permit multiple elements of a cell-site to simultaneously communicate with a remote monitoring and control station in a manner that substantially mitigates and remotely controls the various elements of those cell-sites. Additionally, depending upon the embodiment, the present invention is generally intended to encompass a variety of processes, including modifications and/or refinements of the above-described processes, allowing for dynamic monitoring and control of the various elements of the cell-sites. The cell-site configurations and working ranges, particular elements that can be remotely monitored, the antenna system, interfaces and transceivers used for communication between the cell-sites and the remote monitoring and control station, battery monitoring devices and subsystems and other features can all be varied depending upon the type/needs of the cellular system.

It is specifically intended that the present invention not be limited to the embodiments and illustrations contained herein, but include modified forms of those embodiments including portions of the embodiments and combinations of elements of different embodiments as come within the scope of the following claims.

We claim:

1. A method of remotely monitoring and controlling at least one cell-site, the method comprising:
   (a) receiving data indicative of a status of at least one battery of the at least one cell-site at a remote processing device, wherein the status relates to at least one of a voltage status, a conductance status, and a temperature status;
   (b) processing the data at the remote processing device;
   (c) determining at least one further action that should be taken by the at least one cell-site in response to the data; and
   (d) sending from the remote processing device at least one control signal to the at least one cell-site configured to cause the at least one cell-site to take the at least one further action,
   wherein the received data concerns the status of at least one battery of a first cell-site of the at least one cell-site, and the at least one control signal is sent to a second cell-site of the at least one cell-site.

2. The method of claim 1, wherein the at least one battery includes a plurality of backup batteries, and the data is received from the first cell-site of the at least one cell-site, wherein the first cell-site includes at least one cell-site controller that interfaces the plurality of backup batteries and obtains the data from the backup batteries.

3. The method of claim 2, wherein the first cell-site includes a battery monitoring system that includes the at least one cell-site controller.

4. The method of claim 3, wherein the battery monitoring system further includes a router, wherein the at least one cell-site controller includes a plurality of cell-site controllers each of which is coupled to the router, wherein respective ones of the plurality of backup batteries are coupled to the respective cell-site controllers, and wherein a string of at least two of the backup batteries is coupled to at least one of the cell-site controllers.

5. The method of claim 4, wherein the plurality of backup batteries are coupled to the respective cell-site controllers indirectly by way of a plurality of battery sensors that are respectively coupled to the respective backup batteries.

6. The method of claim 3, wherein the battery monitoring system includes a web server, and the data is provided to the remote processing device in response to a web accessing operation of the web server by the remote processing device.

7. The method of claim 1, wherein the at least one control signal is further sent to the first cell-site.

8. The method of claim 7, wherein if the received data indicates that the at least one battery is about to experience a failure, the at least one control signal is configured to cause an alarm condition to occur at the first cell-site.

9. The method of claim 1, wherein the at least one control signal is a command that a tilt of an antenna system of the second cell-site be adjusted.

10. The method of claim 1, wherein the data is indicative of the conductance status of the at least one battery.

11. A method of remotely monitoring and controlling at least one cell-site, the method comprising:
    (a) receiving data at a remote processing device, wherein the data is indicative of at least one of:
       an operational status of the at least one cell-site; and
       an operational status of at least one component of the at least one cell-site,
    wherein the at least one component is selected from the group consisting of a battery,
    a switchgear, an alarm, a timer, a door sensor, and a transceiver;
    (b) processing the data at the remote processing device;
    (c) determining at least one further action that should be taken by the at least one cell-site in response to the data; and
    (d) sending from the remote processing device at least one control signal to the at least one cell-site configured to cause the at least one cell-site to take the at least one further action,
    wherein the data is received from a first cell-site of the at least one cell-site, and the at least one control signal is sent to a second cell-site of the at least one cell-site.

12. The method of claim 11, wherein the data is indicative of the operational status of the first cell-site of the at least one cell-site and wherein, if it is determined that the first cell-site is offline, the at least one control signal includes at least one tuning instruction.

13. The method of claim 11, wherein the data is indicative of the operational status of the first cell-site of the at least one cell-site and wherein, if it is determined that the first cell-site is experiencing a power outage, the at least one control signal further includes an instruction to activate a generator of the first cell-site.

14. The method of claim 11, wherein the data includes a door sensor signal and wherein, if it is determined that the door sensor signal is indicative of an unexpected door condition, the at least one control signal further includes an instruction to trigger an alarm of the first cell-site.

15. The method of claim 11, wherein the data is indicative of the abnormal network traffic being experienced by the first cell-site, and wherein the at least one control signal further includes at least one tuning instruction.

16. The method of claim 11, wherein the data includes statistics concerning operations of the at least one cell-site, and wherein in response to the receiving of the data the remote processing device updates a log with the statistics.

17. The method of claim 11, wherein the data includes information regarding at least one backup battery of the at least one cell-site, and wherein in response to the receiving of the data the remote processing device determines a state-of-health of the at least one backup battery.

18. The method of claim 11, wherein the at least one control signal is a command that a tilt of an antenna system of the second cell-site be adjusted.

19. A system for remotely monitoring and controlling a plurality of cell-sites, the system comprising:
- means for communicating with the plurality of cell-sites, and a processing device coupled to the means for communicating,
- wherein the means for communicating is configured to receive data from a first cell-site of the plurality of cell-sites and convey the data to the processing device,
- wherein the processing device is configured to analyze the received data and determine, based upon the analyzed data, an operational condition of at least one of the plurality of cell-sites, and
- wherein the processing device generates a control signal to be provided to a second cell-site of the plurality of the cell-sites, the control signal including a command that a tilt of an antenna system of the second cell-site be adjusted.

20. The system of claim 19, wherein the processing device operates in accordance with at least one software program implemented thereon, wherein the processing device analyzes the data to determine an operational condition of at least one battery of the plurality of cell-sites, and wherein the control signal is configured to cause at least one of a switching between a pair of power sources, an increase in monitoring of the at least one battery, and a reconfiguration of at least one antenna of the plurality of cell-sites.

* * * * *